United States Patent
Mehregany et al.

(10) Patent No.: US 7,261,919 B2
(45) Date of Patent: Aug. 28, 2007

(54) SILICON CARBIDE AND OTHER FILMS AND METHOD OF DEPOSITION

(75) Inventors: Mehran Mehregany, Pepper Pike, OH (US); Christian A. Zorman, Euclid, OH (US); Xiao-An Fu, Mayfield Village, OH (US); Jeremy L. Dunning, Berea, OH (US)

(73) Assignee: FLX Micro, Inc., Cleveland, OH (US)

(*) Notice: Subject to any disclaimer, the term of this patent is extended or adjusted under 35 U.S.C. 154(b) by 199 days.

(21) Appl. No.: 10/716,006

(22) Filed: Nov. 18, 2003

(65) Prior Publication Data

US 2005/0106320 A1 May 19, 2005

(51) Int. Cl.
*C23C 16/00* (2006.01)
(52) U.S. Cl. .............. 427/255.11; 427/249.1; 427/249.15; 427/255.17; 427/255.23; 427/255.39
(58) Field of Classification Search .......... 427/249.1, 427/249.15, 255.11, 255.18, 255.17, 255.23, 427/255.26, 255.39, 255.393
See application file for complete search history.

(56) References Cited

U.S. PATENT DOCUMENTS

| | | | | |
|---|---|---|---|---|
| 4,855,254 A | * | 8/1989 | Eshita et al. | 117/94 |
| 5,188,706 A | * | 2/1993 | Hori et al. | 216/12 |
| 5,254,370 A | * | 10/1993 | Nagasawa et al. | 427/255.393 |
| 5,296,258 A | * | 3/1994 | Tay et al. | 438/322 |
| 5,390,626 A | * | 2/1995 | Nagasawa et al. | 427/249.15 |
| 5,541,023 A | * | 7/1996 | Kondo et al. | 378/34 |
| 5,616,426 A | | 4/1997 | Tenhover et al. | |
| 5,698,261 A | * | 12/1997 | Ivanov et al. | 427/255.7 |
| 6,103,590 A | * | 8/2000 | Swanson et al. | 438/409 |
| 6,127,068 A | * | 10/2000 | Shoki et al. | 430/5 |
| 6,189,766 B1 | | 2/2001 | Baker et al. | |

FOREIGN PATENT DOCUMENTS

EP 0445 319 A1 9/1991

OTHER PUBLICATIONS

Hurtos et al "Residual stress and texture in poly SiC films grown by low pressure organometallic chemical vapor deposition" Journal of Applied Physic vol. 87, No. 415 Feb. 2000, pp. 1748-1758.*
Hwang, J-D et al, "Epitaxial Growth and Electrical Characteristics of Beta-SiC on Si by Low-Pressure Rapid Thermal Chemical Vapor Deposition." Japanese Journal of Applied Physics. Tokyo, JP, vol. 34, No. 3, Part 1, Mar. 1995, pp. 1447-1450. XP-000703002.
Sarro, P.M. et al,.; "Low-Stress PECVD SiC thin films for IC-compatible microstructures." Sensors and Actuators A, Elsevier Sequoia S.A., Lausanne, CH, vol. 67, No. 1-3, May 15, 1998, pp. 175-180.
Search Report for PCT/US2004/037064, published Sep. 12, 2005.

* cited by examiner

*Primary Examiner*—Archene Turner (57) ABSTRACT

A method of depositing a ceramic film, particularly a silicon carbide film, on a substrate is disclosed in which the residual stress, residual stress gradient, and resistivity are controlled. Also disclosed are substrates having a deposited film with these controlled properties and devices, particularly MEMS and NEMS devices, having substrates with films having these properties.

19 Claims, 7 Drawing Sheets

SILICON CARBIDE AND OTHER FILMS AND METHOD OF DEPOSITION

STATEMENT REGARDING FEDERALLY SPONSORED RESEARCH OR DEVELOPMENT

A part of this invention was made with government support under Contracts No. NCA3-201 awarded by NASA and DABT 63-1-0010 awarded by DARPA. The government has certain rights in this invention.

BACKGROUND

The present invention relates to silicon carbide and other films, and, more particularly, to controlled deposition of these films on a substrate.

Semiconductor, micro- and nanoelectromechanical systems (MEMS/NEMS) apply integrated circuit fabrication technology to fabricate optical, mechanical, electrochemical, and biosensor devices. One of the important steps in creating MEMS and NEMS devices is the deposition of thin films of material onto substrates. Once the films are deposited, various etching techniques may be employed to shape the deposited film.

In typical MEMS/NEMS devices, silicon is a primary material. Silicon carbide is a material that has very good physical and chemical characteristics, and is noted for these properties at temperatures above about 300° C. Silicon carbide is an advantageous material for use in films for MEMS and NEMS, particularly because of its exceptional electrical, mechanical, and chemical properties compared to silicon in normal and harsh operating environments.

One of the barriers limiting development of silicon carbide in MEMS production has been the inability to deposit uniform films of silicon carbide on large area substrates having properties that are advantageous to and required for MEMS and NEMS. Deposition of silicon carbide is conventionally subject to variations in residual stress, residual stress gradient, and electrical resistivity. These properties are important to the proper operation of MEMS and NEMS devices.

With silicon, residual stress, residual stress gradient and electrical resistivity can be controlled after the film is deposited by annealing the film at elevated temperatures. Annealing in silicon induces crystallographic changes that result in the modification of these properties. With single crystalline and polycrystalline silicon carbide, such an approach is not feasible because silicon carbide is chemically and crystallographically stable at conventional annealing temperatures. For silicon carbide films deposited on silicon substrates, annealing is completely ineffective because the non-silicon carbide substrate limits the annealing temperatures to temperatures too low for effective annealing. The present invention bypasses the need for annealing altogether by implementing control of the residual stress, residual stress gradient, and electrical resistivity in the silicon carbide films during the film formation (deposition) process.

SUMMARY OF THE INVENTION

The present invention provides methods of depositing films on a substrate that enables control of the residual stress, residual stress gradient, and electrical resistivity of the deposited film. The invention includes films of various compositions, such as ceramic films with the ceramic compound having a metallic and non-metallic component. Preferably, the film is a silicon carbide film. The silicon carbide film is deposited by chemical vapor deposition onto a substrate, such as a silicon substrate, by placing the substrate in a reaction chamber and evacuating the chamber to a pressure below about 10 mtorr. The temperature of the chamber is maintained at about 900° C. A carbon precursor, such as acetylene (5% in hydrogen) is supplied to the chamber at a flow rate of about 180 standard cubic centimeters per minute (sccm). A silicon precursor, such as dichlorosilane (DCS), is supplied to the chamber at a flow rate of about 54 sccm. As the precursors are supplied, the pressure of the reaction chamber increases and may be maintained at a fixed pressure.

Under these conditions, tensile films with appreciable stress gradients are deposited at pressures less than 2.65 torr and compressive films with appreciable stress gradients are deposited at pressures greater than 2.65 torr. At 2.65 torr, the film has a very low residual tensile stress (<20 MPa), a negligible stress gradient, and a resistivity that is less than 10 $\Omega \cdot cm$ without intentional doping. So control of the pressure with other parameters fixed resulted in control of the residual tensile stress, stress gradient, and electrical resistivity.

In another embodiment, the chamber is maintained at a pressure of about 2.0 torr. A carbon precursor, such as acetylene (5% in hydrogen), is supplied to the chamber at a flow rate of about 180 standard cubic centimeters per minute (sccm). A silicon precursor, such as DCS, is supplied to the chamber at a flow rates between 18 and 72 sccm. Under these conditions, tensile films with appreciable stress gradients are deposited at DCS flow rates below 35 sccm and compressive films with appreciable stress gradients are deposited at DCS flow rates above 35 sccm. At a DCS flow rate of 35 sccm, the film has a very low residual tensile stress (<20 MPa), a negligible stress gradient and a resistivity that is less than 10 $\Omega \cdot cm$ without intentional doping. So control of the flow rate of the metal element precursor, in this case the silicon precursor DCS, with other parameters fixed resulted in control of the residual tensile stress, stress gradient, and electrical resistivity.

The present invention also relates to substrates having a silicon carbide film deposited thereon in which the residual stress is 0±100 MPa and the achieved electrical resistivity is less than about 10 $\Omega \cdot cm$, and to semiconductor, MEMS, and NEMS devices having such substrates.

DETAILED DESCRIPTION

The present invention relates to the deposition of film, preferably a silicon carbide (SiC) film, onto a substrate with control of various properties, such as residual stress, residual stress gradient, and electrical resistivity. The invention will be described as it relates to deposition of SiC onto a silicon substrate, particularly for use with MEMS and NEMS devices. The invention, however, is only exemplified by such description and is limited only by the claims included herein.

Silicon carbide film, particularly polycrystalline SiC film, is desirable for use in MEMS and NEMS devices, as described above. Control of key properties, such as residual tensile stress, residual tensile stress gradient, and electrical resistivity, provides SiC films that may be effectively used in MEMS and NEMS devices. Silicon carbide films having low residual stress, less than about 100 MPa, and preferably less than about 50 MPa, are highly desirable for MEMS and NEMS applications. Conventional deposition techniques have heretofore been unable to achieve such low stress values in polycrystalline silicon carbide films.

In these and other applications, control of stress properties, such as residual stress and residual stress gradient, and electrical resistivity properties also may be desired to achieve other preselected values that may not be low stress values.

These films are particularly suitable for use in devices operating in harsh environments because of the outstanding mechanical, electrical, and chemical properties of SiC. Examples of such applications include pressure sensors for internal combustion and jet engines, wind tunnel sensors and instrumentation, and instrumentation and control systems of nuclear power systems. In addition, silicon carbide can be used in device structures commonly made from silicon, such as acceleration sensors, biomedical sensors and actuators and other applications not typically characterized by harsh environments. Silicon carbide can be used as an alternative material to silicon, capitalizing on the superior mechanical and chemical properties, as well as comparable electrical properties between SiC and silicon.

Applicants have successfully produced thin polycrystalline SiC films with controlled properties on silicon and silicon dioxide substrates in which the residual tensile stress is at or near zero, the electrical resistivity is very low, and the residual tensile stress gradient is near zero. These films were produced by a low pressure chemical vapor deposition process, using dicholorosilane ($SiH_2Cl_2$) as the precursor for silicon (Si) and a mixture of 5% acetylene ($C_2H_2$) in hydrogen ($H_2$) as the precursor for carbon. Applicants have determined that control of the silicon precursor flow rate and/or the pressure at which the deposition occurs allows for production of SiC film having the properties described above. Successful production of cantilevers, bridges, membranes, and lateral resonant structures has been completed, demonstrating the viability of the material fabricated in accordance with the present invention in micromachining applications.

It is believed that control of the flow rate of silicon precursor and/or the deposition pressure of the reaction chamber while other parameters are fixed will enable control of the residual stress, the residual stress gradient, and the electrical resistivity of silicon carbide film deposited by vapor deposition for any silicon precursor and carbon precursor. One of ordinary skill in art may determine the appropriate pressure and silicon precursor flow rate to achieve minimum residual stress, residual stress gradient, and electrical resistivity without undue experimentation, and use of alternate silicon and carbon precursors does not depart from the spirit and scope of the invention.

Examples of possible alternate silicon precursors include silane, trichlorosilane, and tetrachlorosilane, among others. Possible alternate carbon precursors include carbon-containing gases, methane, propane, ethylene, xylene, butane, carbon tetrabromide, and other hydrocarbons.

Possible alternate silicon and/or carbon precursors may include single-source precursors for both silicon and carbon. Examples of possible single-source precursors for both silane and carbon include halosilane, trimethylsilane, tetramethylsilane, dimethyldimethoxysilane, tetramethylcyclotetrasiloxane, bis-trimethylsilylmethane, methyltrichlorosilane, tetraethylsilane, silacyclobutane, disilabutane, and any other material suitable for use as a single source precursor, as can be determined by one of ordinary skill in the art.

If a single-source precursor is used, then either a separate carbon precursor or silicon precursor may be provided to the chamber in order to correctly control the ratio of carbon to silicon in the reactor. In this, event, the flow rate of the single source of the silicon or the single source of the carbon may be varied to achieve the proper ratio of carbon gas to silicon gas within the chamber so that the appropriate reaction occurs at the appropriate rate to deposit the silicon carbide film with the properties described above.

Other silicon-based films, such as silicon nitride ($Si_3N_4$), silicon dioxide ($SiO_2$), silicon oxynitride ($SiO_xN_y$) and silicon carbon nitride ($SiC_xN_y$) may also be deposited with the method of the present invention using the appropriate precursors. In the case of silicon nitride, appropriate precursors may include silane ($SiH_4$) or DCS for a silicon precursor, and ammonia ($NH_3$) for a nitrogen precursor. The silicon precursor flow rate or the deposition pressure may be varied to achieve a deposited film having the properties described above. The optimal range of deposition pressure and silicon precursor flow rate may be determined without undue experimentation in accordance with this invention.

Other ceramic films based on a non-silicon ceramic may also be deposited with the method of the present invention to achieve the properties described above. Use of the term "ceramic" herein is defined as inorganic, nonmetallic materials, typically crystalline in nature (but could be amorphous), and generally are compounds formed between metallic and nonmetallic elements, such as aluminum and oxygen (alumina—$Al_2O_3$), calcium and oxygen (calcia—CaO), silicon and oxygen (silica—$SiO_2$), and other analogous oxides, nitrides, borides, sulfides, and carbides. The flow rate of the nonmetallic precursor is held fixed and the deposition pressure or the flow rate of the metallic precursor would be varied to achieve the properties described above. The optimal range of deposition pressure and metallic precursor flow rate may be determined without undue experimentation using the procedures provided herein.

Other compound semiconducting films based on materials other than silicon may also be deposited with the method of the present invention to achieve the properties described above. These materials include, but are not limited to, GaN, GaAs, InP, and other analogous semiconductor materials deposited by chemical vapor deposition.

The examples described herein use silicon as the substrate material. The method described herein is not limited to use of silicon and silicon derivative substrates, such as silicon carbide and silicon dioxide, but rather can be applied to the deposition on any substrate material where the resultant film is subjected to a residual stress.

TEST PROCEDURE

Figure 1:
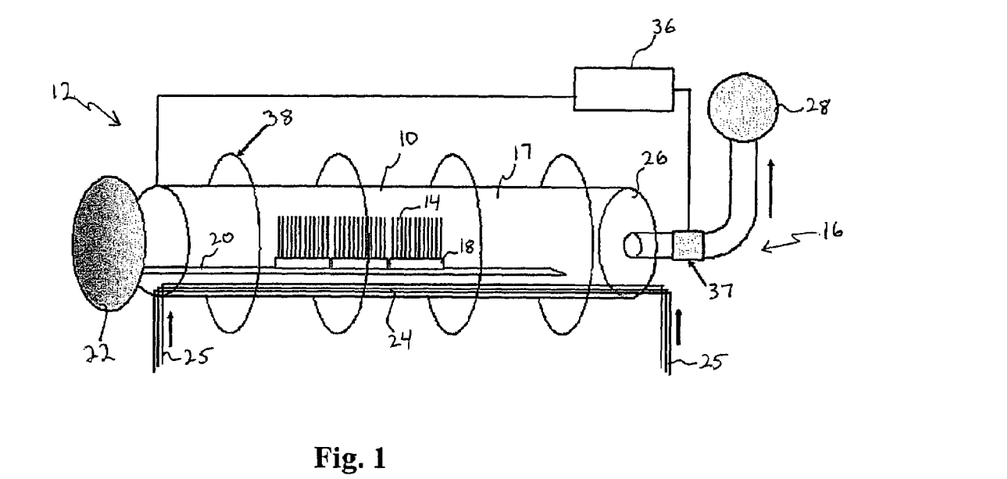
FIG. 1 is a schematic view of an apparatus used in the present invention.
Figure 2:
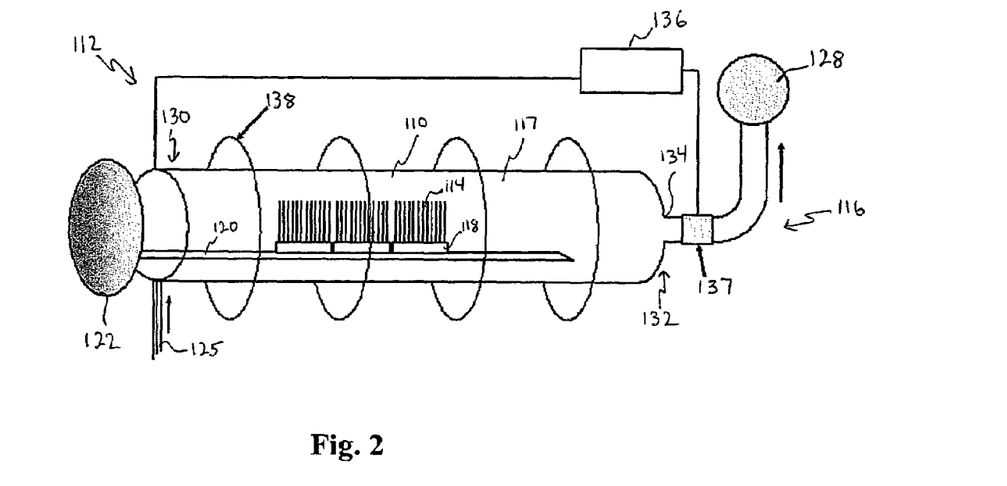
FIG. 2 is a schematic view of another embodiment of an apparatus used in the present invention.

FIGS. 1 and 2 illustrate the apparatuses used to conduct the following procedures. Prior to loading silicon substrate, wafers, of chips into a reaction chamber 10, 110 of a low pressure vapor deposition apparatus 12, 112, the wafers 14, 114 were cleaned using a standard RCA cleaning procedure. Silicon wafers 14, 114 of 100 mm diameter were placed into a conventional hot-wall horizontal cylindrical quartz furnace 16, 116. The reaction or deposition chamber 10, 110 was 2007 mm in length and 225 mm in diameter. The wafers were held in a SiC boat 18, 118 that rested on a paddle 20, 120 attached to a moveable front flange 22, 122 and placed near the center of the reaction chamber 10, 110.

In the configuration illustrated in FIG. 1, two small injection tubes 24, one for the dicholorosilane and one for the acetylene, were used to introduce these precursor gases into the chamber 10 directly underneath the boat 18. To accommodate these injection tubes 24, the furnace tube was of conventional design, consisting of a long, quartz cylinder 17 that was capped on each end with metal flanges 22, 26. The injection tubes 24 were attached to small ports on each of these flanges 22, 26. The front flange 22 consisted of a large circular plate that served as the chamber door. This door was attached to a cantilever assembly for automatic loading and unloading. The paddle 20 holding the SiC 18 boat was attached only to the inside surface of the front flange door assembly 22. The rear flange 26 was not movable and was equipped with an outlet port that was attached to the vacuum system 28. Precursor gases were simultaneously introduced via the gas injection tubes 24 through gas inlets 25 and ports in both the front flange 22 and the rear flange 26.

In a second configuration illustrated in FIG. 2, the injector tubes 24 were omitted. In this configuration, the furnace tube consisted of a long quartz cylinder 117 that was circular in cross section at the front end 130 and conical in shape at the rear 132. The front flange assembly 122 was as described above and was affixed to the front end 130 of the cylinder. The rear 132 of the cylinder needed no flange, but instead contained a quartz nipple 134 that attached directly to the vacuum system 128. Gases were introduced into the chamber through gas inlets 125 and ports in the front flange 122. No tooling was included to inject the gases directly beneath the wafer boat 118.

The vacuum system 28, 128 consisted of a roots blower and mechanical pump combination (not shown) that can reach a base pressure of less than 1 mtorr in a fully loaded system, regardless of configuration. Pressure was controlled through pressure control system 36, 136. A butterfly valve 37, 137 was provided to assist with the pressure control. The gas flow rates and pressure control systems 36, 136 were controlled by a conventional furnace control computer system (not shown). The temperature in the reaction chamber 10, 110 was controlled via resistive heating coils 38, 138.

Each load consisted of 25 Si wafers evenly distributed in a single, 50-slot SiC boat. The first and last five wafers were designated as baffling wafers to stabilize gas flow. Wafers in slots 6, 10, 13, 16, and 20 from the loading end were designated for study.

EXAMPLE 1

FIG. 1 illustrates the low pressure chemical vapor deposition apparatus 12 used for these tests. Depositions were performed for two hours at pressure settings from about 0.42 torr to about 5 torr. In several cases, longer times were used to deposit thicker films. The flow rates of DCS and acetylene (5% in hydrogen) were held constant at about 54 standard cubic centimeters per minute (sccm) and 180 sccm, respectively. The temperature was held fixed at about 900° C. The furnace was configured with injector tubes to introduce the acetylene and DCS gases into the reaction chamber.

Following each deposition, the thickness of the films was measured optically using a Nanospec 4000 AFT spectrophotometer. The film residual stresses were determined by measuring the curvature of the silicon wafers before and after film deposition, using a laser-based curvature measuring system (Frontier Semiconductor measurement, FSM 120). Silicon carbide films were deposited on both sides of the wafer, and reactive etching in a $CHF_3/O_2$ mixture was used to remove the film deposited on the backside of the wafers.

Figure 3:
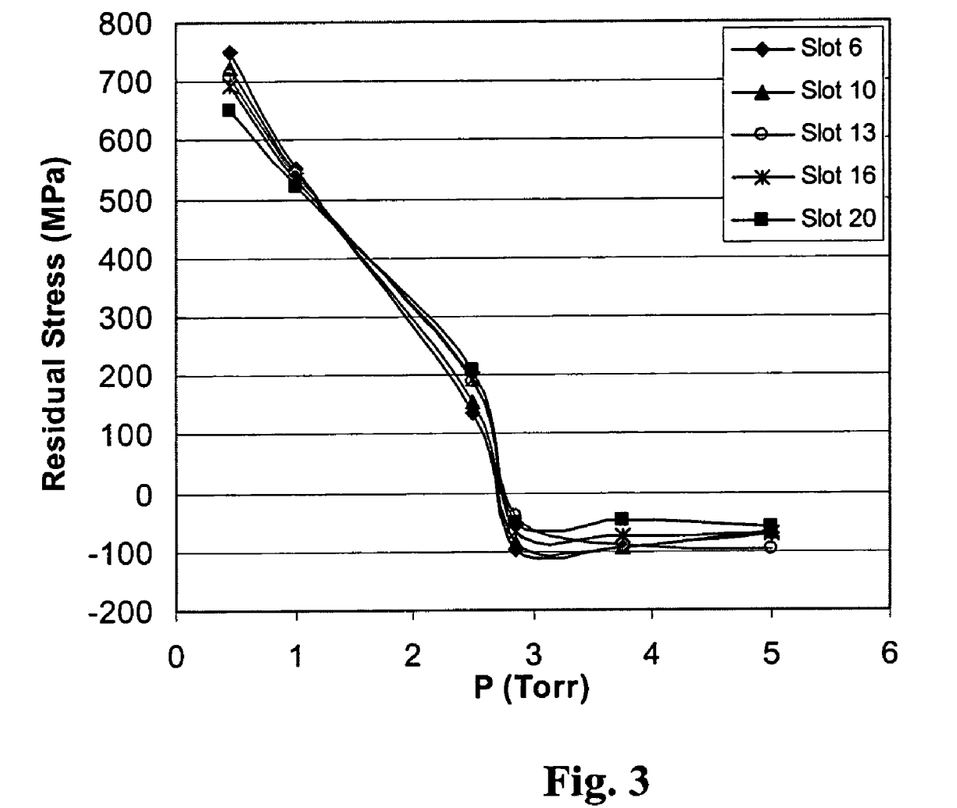
FIG. 3 is a graph of residual stress versus pressure for one embodiment of the present invention.

FIG. 3 illustrates the relationship between the deposition pressure and the residual tensile stress of the SiC at 900° C. resulting from this series of tests. The residual stress changed roughly from about 700 MPa (tensile) at 456 mtorr to about −100 MPa (compressive) at 5 torr, with films deposited at about 2.65 torr having near zero residual stress. Films deposited at pressures from about 2.5 torr to about 5 torr had stress values between about 100 MPa and −100 MPa. The value of stress varied little from wafer to wafer in the same run, as indicated by FIG. 3.

Single layer cantilever beams were fabricated from about 500 nm-thick polycrystalline SiC films made in accordance with this example to characterize the stress gradient at various deposition pressures. The stress gradient is the change in the magnitude of residual stress as a function of film thickness. Stress gradients can cause cantilever beams to bend, whereas beams made from films with little or no stress gradient remain flat. For MEMS and NEMS devices, a stress gradient near zero is desirable when the planarity of device structures is required. A residual stress gradient in the structural layers of MEMS/NEMS devices is desirable in applications where curved or strained structures are needed. In such structures, precise control of residual stress gradient is required. Control of stress gradients requires precision control of residual stresses.

Figure 4A:
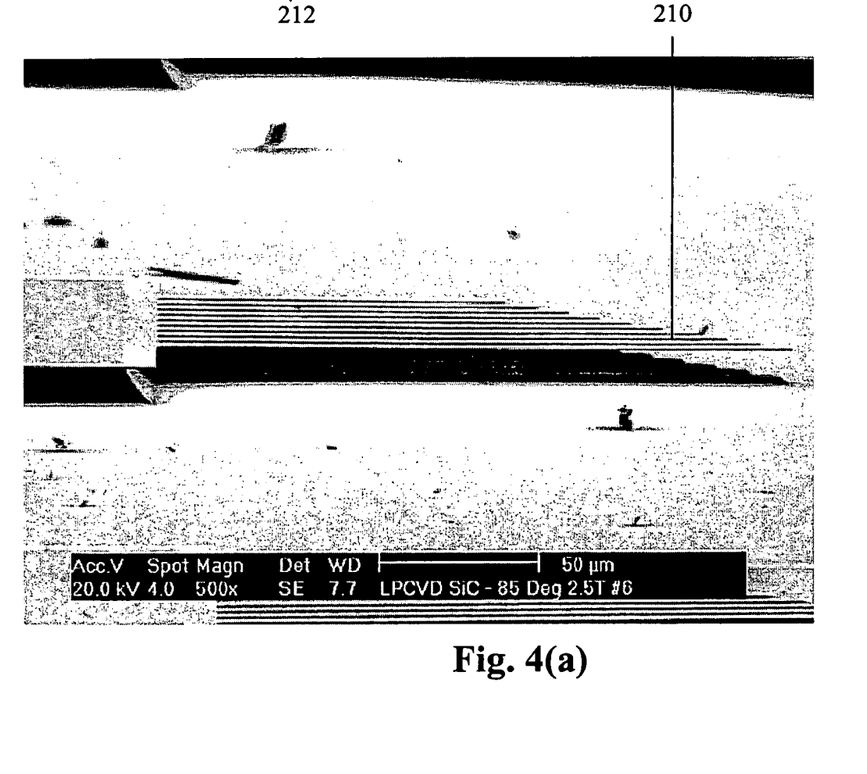
FIG. 4(a) is a SEM micrograph of a silicon carbide cantilever from a film made in accordance with one embodiment of the present invention.
Figure 4B:
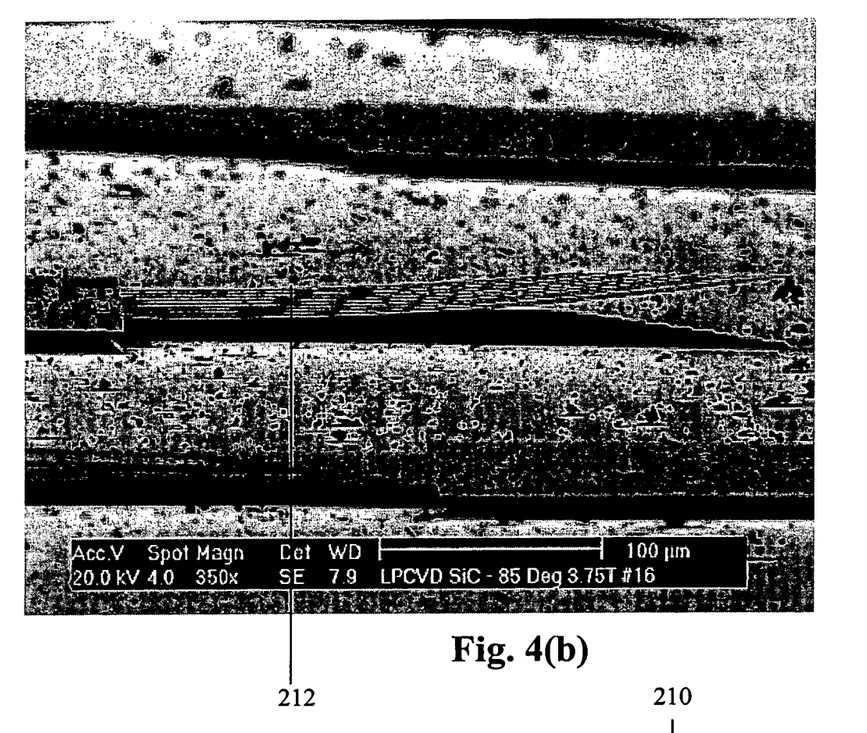
FIG. 4(b) is another SEM micrograph of a silicon carbide cantilever from a film made in accordance with one embodiment of the present invention.

FIG. 4(a) illustrates a cantilever beam 210 made in accordance with the present invention at about 2.65 torr. The beam 210 is generally flat and exhibits little, if any, bending. FIG. 4(b) illustrates a stressed cantilever beam 212 made in accordance with the present invention at about 3.75 torr. This beam 212 bends slightly upward.

Figure 5:
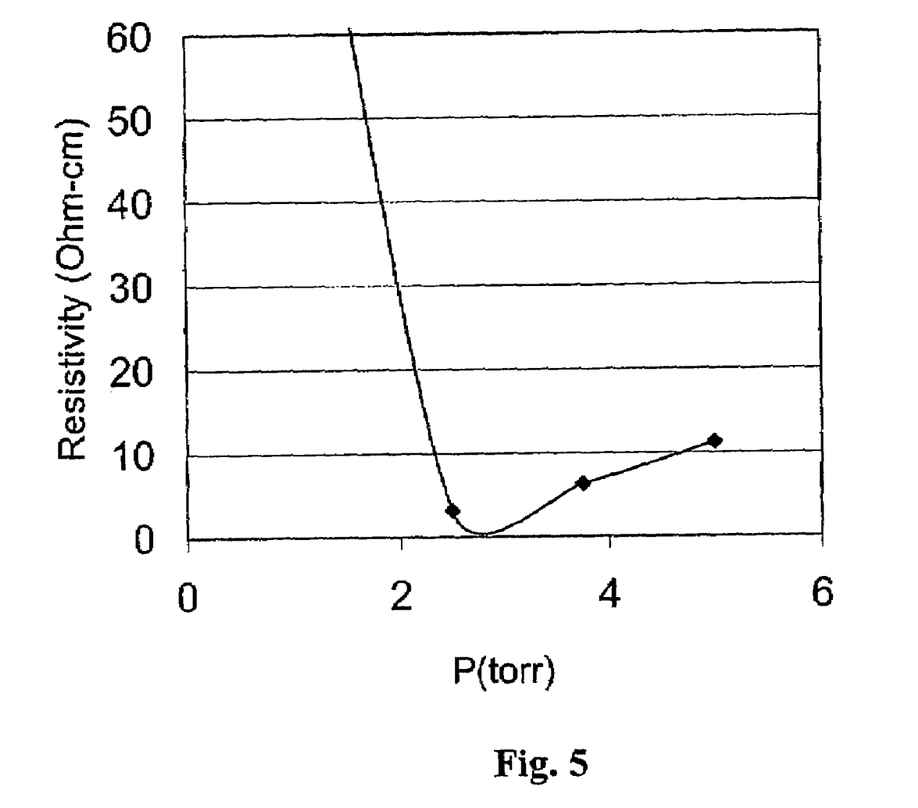
FIG. 5 is a graph of electrical resistivity versus deposition pressure for one embodiment of the present invention.

FIG. 5 illustrates the electrical resistivity of films made in accordance with the present invention at various deposition pressures. These data indicate a relationship between deposition pressure and electrical resistivity. The minimum electrical resistivity occurs near the deposition pressure at which the residual stress and the residual stress gradient are nearly zero, namely, about 2.65 torr. Electrical resistivity is less than 10 Ω·cm at deposition pressures from slightly greater than about 2.0 torr to about 4.5 torr. While these values may seem high relative to other semiconductors (including SiC), these measurements were made from polycrystalline films that were not doped either before or after deposition. It is common practice to use doping procedures to reduce the electrical resistivity of semiconducting materials, especially SiC. These findings strongly suggest that doping during the deposition process will be most effective using conditions that favor low stress and low stress gradients.

EXAMPLE 2

The same procedure described above was used, except that the low pressure chemical vapor deposition apparatus 112 illustrated in FIG. 2 was used (no injectors, single front flange). For this series of tests, the deposition pressure was maintained essentially constant at about 2.0 torr, and the flow rate of the silicon precursor, in this case DCS, was varied between about 18 sccm and about 54 sccm. The flow rate of acetylene (5% in hydrogen) was fixed at about 180 sccm, and the temperature of the reaction chamber was maintained at about 900° C.

Figure 6:
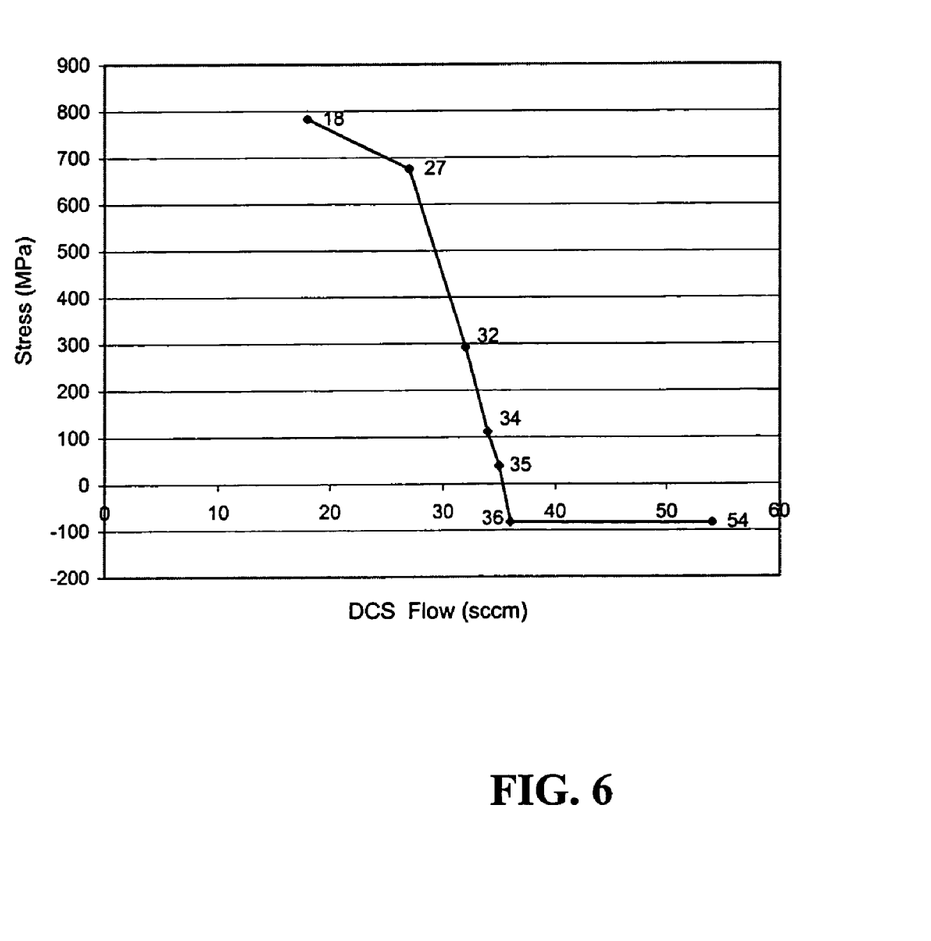
FIG. 6 is a graph of residual stress versus dischlorosilane flow rate for one embodiment of the present invention.

As above, the films were characterized for residual stress, residual stress gradient, and electrical resistivity. FIG. 6 illustrates the measured residual stress versus the flow rate of the DCS. The observed residual stress decreased as a function of DCS flow rate until a flow rate of 36 sccm. The residual stress was substantially the same at a flow rate of 54 sccm as it was at a flow rate of 36 sccm. The residual stress as a function of flow rate, as illustrated in FIG. 6, appears to be similar to the residual stress as a function of deposition pressure, as illustrated in FIG. 3.

Figure 7:
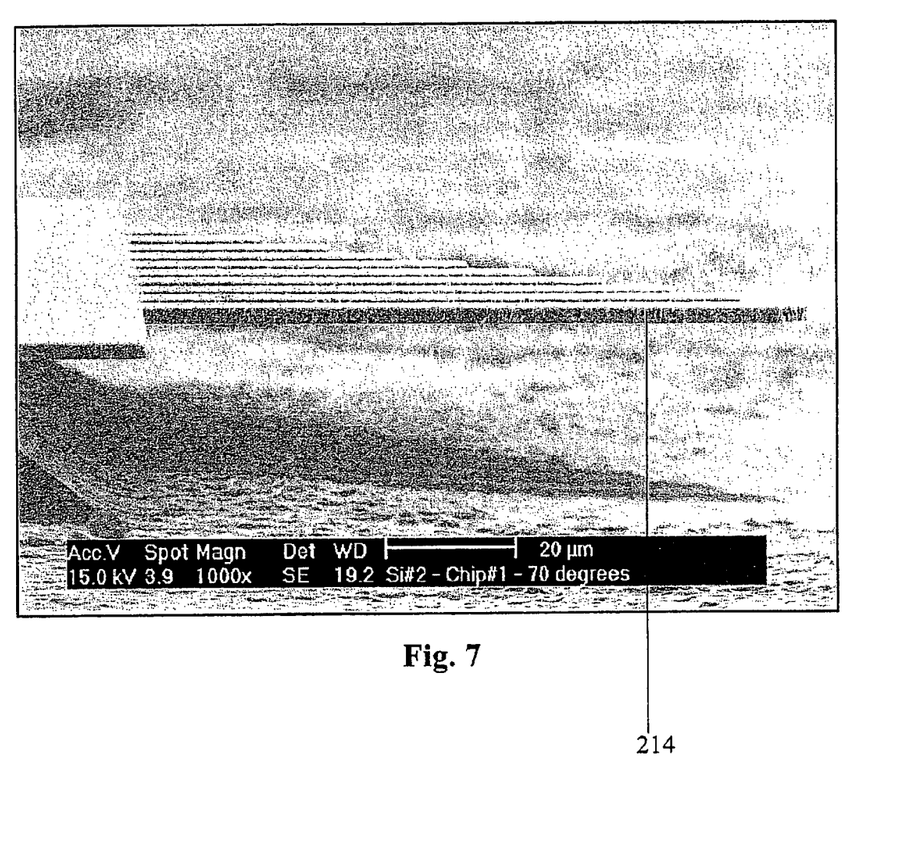
FIG. 7 is a SEM micrograph of a silicon carbide cantilever from a film made in accordance with one embodiment of the present invention.

FIG. 7 is a SEM micrograph of a micromachined second cantilever beam 214 made in accordance with this example of the present invention at a dicholorosilane flow rate of about 35 sccm. As seen from FIG. 6, a dicholorosilane flow rate of about 35 sccm corresponds to residual stress of less than 50 MPa. Films with low residual stress values, such as the second cantilever beam 214 in FIG. 7, exhibit very low residual stress gradient. The second cantilever beam 214 illustrated in FIG. 7 exhibits substantially no bending.

Figure 8:
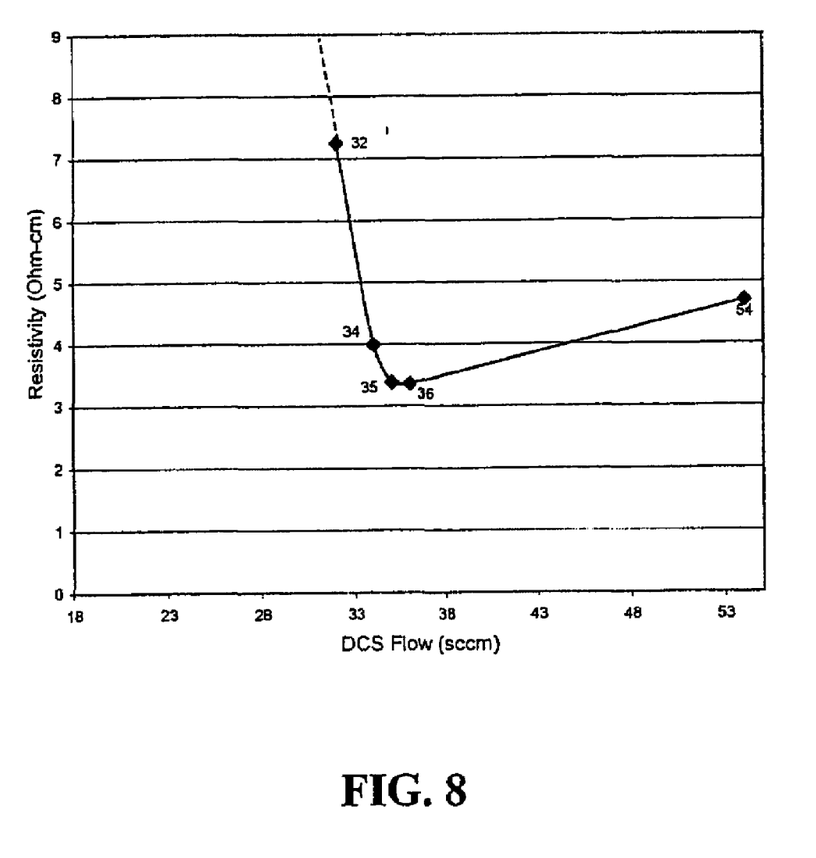
FIG. 8 is a graph of electrical resistivity versus dischlorosilane flow rate for one embodiment of the present invention.

FIG. 8 is a graph of electrical resistivity versus DCS flow rate, illustrating that the electrical resistivity exhibits a strong relationship to DCS flow rate. The minimum value of electrical resistivity, slightly greater than 3 Ω·cm, occurs at 35 sccm and 36 sccm DCS. As with Example 1, the films were not intentionally doped either during or after the deposition process. In this example, the electrical resistivity value and the residual stress nearest to zero occurred at a DCS flow rate of about 35 sccm.

While the present invention has been illustrated by the above description of embodiments, and while the embodiments have been described in some detail, it is not the intent of the applicants to restrict or in any way limit the scope of the invention to such detail. Additional advantages and modifications will readily appear to those skilled in the art, such as the use of alternate precursors or the deposition of alternate films. Therefore, the invention in its broader aspects is not limited to the specific details, representative apparatus and methods, and illustrative examples shown and described. Accordingly, departures may be made from such details without departing from the spirit or scope of the applicants' general or inventive concept.

We claim:

1. A process for achieving a predetermined value in a desired property selected from residual stress and electrical resistivity in a product ceramic film deposited on a substrate by low pressure chemical vapor deposition, the ceramic being formed from a metallic element and a non-metallic element, the product ceramic film being formed by supplying a metallic element precursor to a reaction chamber, separately supplying a non-metallic element precursor different from the metallic element precursor to the reaction chamber under conditions of temperature and pressure such that the metallic element precursor and the non-metallic element precursor react to form the product ceramic film on a substrate inside the reaction chamber, the process comprising
   (a) selecting pressure or flow rate of the metallic element precursor as the control variable,
   (b) determining the relationship between the desired property and the control variable when the remaining variables in the low temperature vapor deposition process are held at selected fixed values, and
   (c) during formation of the product ceramic film, achieving the predetermined value for the desired property by controlling the control variable while maintaining the remaining variables at the above selected fixed values.

2. A process according to claim 1 for achieving a desired residual stress or electrical resistivity in a product silicon carbide film deposited on a substrate by low pressure chemical vapor deposition, the product silicon carbide film being formed by supplying a silicon precursor to a reaction chamber, a separately supplying a carbon precursor different from the silicon precursor to the reaction chamber under conditions of temperature and pressure such that the silicon precursor and the carbon precursor react to form the product silicon carbide film on a substrate inside the reaction chamber, the process comprising
   (a) selecting pressure or flow rote of the silicon precursor as the control variable,
   (b) determining the relationship between residual stress or electrical resistivity and the control variable when the remaining variables in the low temperature vapor deposition process are held at selected fixed values, and
   (c) during formation of the product silicon carbide film, achieving the desired residual stress or electrical resistivity by controlling the control variable while maintaining the remaining variables at the above selected fixed values.

3. The method of claim 2, wherein the silicon precursor is selected from the group consisting of silane, halosilane, trimethylsilane, tetramethylsilane, dimethyldimethoxysilane, tetramethylcyclotetrasiloxane, bis-trimethylsilylmethane, methyltrichlorosilane, silane, tetraethylsilane, and silacyclobutane.

4. The method of claim 3, wherein the halosilane is selected from the group consisting of dichlorosilane, trichlorosilane, and tetrachlorosilane.

5. The method of claim 4, wherein the silicon precursor is dichlorosilane.

6. The method of claim 2, wherein the flow rate of the carbon precursor is about 180 standard cubic centimeters per minute.

7. The method of claim 2, wherein supplying carbon precursor comprises supplying acetylene in hydrogen to the reaction chamber at a flow rate of about 180 standard cubic centimeters per minute.

8. The process or claim 2, wherein the product silicon carbide film is produced to have a predetermined electrical resistivity of about 10 Ω·cm or less.

9. The process of claim 8, wherein the predetermined electrical resistivity is achieved by controlling silicon precursor flow rate.

10. The process of claim 9, wherein the silicon precursor flow rate is set to a value between about 30 and 54 sccm to achieve the predetermined electrical resistivity.

11. The process of claim 8, wherein the predetermined electrical resistivity is achieved by controlling pressure.

12. The process of claim 11, wherein pressure is set to a value between about 0.42 torr and about 5 torr to achieve the predetermined electrical resistivity.

13. The process of claim 2, wherein the product silicon carbide film is produced to have a predetermined residual stress between about 700 MPa to about and −100 MPa.

14. The process of claim 13, wherein the predetermined residual stress is achieved by controlling pressure.

15. The process of claim 14, wherein the pressure in the reaction chamber is set to a value between about 0.42 torr and about 5 torr to achieve the predetermined residual stress.

16. The process of claim 15, wherein the pressure in the reaction chamber is set to a value of about 2 torr.

17. The process of claim 13, wherein the predetermined residual stress is achieved by controlling silicon precursor flow rate.

18. The process of claim 17, wherein the silicon precursor flow rate is set to a value between about 18 and 54 sccm to achieve the predetermined residual stress.

19. A method of depositing a silicon carbide film on a substrate by chemical vapor deposition, comprising
   (a) placing at least one substrate in a reaction chamber;
   (b) maintaining the reaction chamber at a predetermined pressure;
   (c) supplying carbon precursor to the reaction chamber at a predetermined fixed flow rate;
   (d) supplying silicon precursor to the reaction chamber at a flow rate; and
   (e) controlling the silicon precursor flow rate to control the stress in the deposited silicon carbide film.

* * * * *